(12) United States Patent
Yan

(10) Patent No.: US 12,198,771 B2
(45) Date of Patent: Jan. 14, 2025

(54) FUSE LINK PROGRAMMING CELL, PROGRAMMING CIRCUIT, CONTROL CIRCUIT, AND ARRAY

(71) Applicant: Shanghai Huali Integrated Circuit Corporation, Shanghai (CN)

(72) Inventor: Ying Yan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 148 days.

(21) Appl. No.: 18/141,946

(22) Filed: May 1, 2023

(65) Prior Publication Data

US 2023/0386590 A1 Nov. 30, 2023

(30) Foreign Application Priority Data

May 30, 2022 (CN) .......................... 202210597642.9

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ...................................................... G11C 17/18
USPC ........................................................... 365/96
See application file for complete search history.

(56) References Cited

U.S. PATENT DOCUMENTS

| | | | |
|---|---|---|---|
| 8,767,433 B2* | 7/2014 | Kurjanowicz | H10B 20/25 365/96 |
| 2008/0212387 A1* | 9/2008 | Hoefler | G11C 17/16 365/225.7 |

* cited by examiner

*Primary Examiner* — Muna A Techane
(74) *Attorney, Agent, or Firm* — Banner & Witcoff, Ltd.

(57) ABSTRACT

A fuse programming unit, comprising: two efuse units and a mode control tube. The first efuse unit includes: one end of the first fuse forms the first end, and the second end is connected to the drain end of the first MOS. The first MOS source terminal is grounded, and the first word line formed by the gate terminal. The second efuse unit includes: the first end of the second fuse forms the second wire end, and the second end is connected to the drain end of the second MOS. The second MOS source terminal is grounded, and the gate terminal forms the second line. The source end of the mode control transistor is connected to the line end of the second efuse unit, the drain end is connected to the source end of the first MOS, and the gate end forms the correction end.

9 Claims, 10 Drawing Sheets

FUSE LINK PROGRAMMING CELL, PROGRAMMING CIRCUIT, CONTROL CIRCUIT, AND ARRAY

CROSS-REFERENCES TO RELATED APPLICATIONS

This application claims the priority to Chinese patent application No. CN202210597642.9, filed on May 30, 2022, and entitled "FUSE LINK PROGRAMMING CELL, PROGRAMMING CIRCUIT, CONTROL CIRCUIT, AND ARRAY", the disclosure of which is incorporated herein by reference in entirety.

TECHNICAL FIELD

The present application relates to the field of integrated circuits, in particular, to a fuse link programming cell, a fuse link programming circuit, a control circuit of the fuse link programming cell, and a fuse link programming cell array.

BACKGROUND

Based on the principle of electronic migration (EM), eFuse realizes a programming function by means of link fusion. Essentially, a read module inside the efuse converts a link resistance into a corresponding logic value, and a specific principle is that a comparison circuit compares the link resistance with a reference resistance before and after the fusion so as to generate different levels. However, during programming, an efuse cell may undergo unexpected situations such as an unbroken link, or an excessively small resistance generated after the programming, resulting in a wrong logic value output by the read module.

The conventional efuse cell comprises one link and one NMOS control select transistor, referring to FIG. 1.

An array composed of the conventional efuse cells is shown in FIG. 2, where the array comprises bit lines BLs and word lines WLs. Each bit line in the array is connected to an SA module by means of one NMOS read select transistor Nsa, and a control signal of a gate end of the read select transistor Nsa is RD. Each word line in the array is connected to gate ends of control select transistors of efuse cells on the same row, and each bit line is connected to link ends of the efuse cells on the same row. Each bit line in the array is connected to a programming power supply VDDQ by means of one PMOS power supply select transistor Mpn, and a gate end of the transistor is controlled by a BLC signal.

During programming on the conventional efuse cell array, if RD=0, paths from all the bit lines BLs to the SA module in the array are turned off. If one bit line control BLC signal in the array is 0, a path from VDDQ to the bit line BL is turned on, so that a voltage of the bit line BL is VDDQ; and if another bit line control BLC signal is VDDQ, a path from VDDQ to the bit line BL is turned off. If one word line WL in the array is gated, a voltage on the word line is VDDQ, and NMOS select transistors of all efuse cells on the line are turned on; and if another word line WL in the array are not gated, a voltage is 0, and NMOS select transistors of all efuse cells on the line are turned off. In an efuse cell between the bit line BL having a voltage of VDDQ and the word line WL having a voltage of VDDQ, a path from VDDQ to the ground is formed, and a programming current flows through a link and fuses the link to program the efuse cell. Other efuse cells remain in a non-programmed state as no path from VDDQ to the ground is formed.

For the purpose of correcting a programming output of the efuse cell, a conventional method is adding redundant correction bits in addition to normal storage bits. By programming these redundant correction bits, address information and a correct value of a bit to be corrected may be recorded in a redundant region. During a read operation, if an input address is an address where an error occurs, the system ignores an error value stored at the address and reads a preset correct value from the redundant region, equivalent to correcting the error value. Such the correction method adopts indirect correction. That is, in order to correct one error bit, a region of more than ten bits is required to store address and correct value information of the error bit, thus requiring a large redundant region while achieving a very small correction amount, in which case relevant circuit and layout designs are complex and have low reliability.

BRIEF SUMMARY

A series of concepts of simplified forms are introduced in the summary of the present application. The concepts of simplified forms are described in details in the specific implementations. The summary of the present application is not intended to define the key features and necessary technical features of the technical solution set forth, let alone to determine the scope of protection of the technical solution set forth.

The present application provides a novel fuse link programming cell, as well as a fuse link programming circuit, a control circuit of the fuse link programming cell, and a fuse link programming cell array.

The fuse link programming cell according to the present disclosure includes: two effuse cells and one mode control transistor Nsw.

A first effuse cell includes:
a first fuse link (link1), wherein one end of the first link forms a first connection end of the fuse link programming cell, the first connection end being connected to a first bit line BL1, and a second connection end is connected to a drain end of a first MOS N1; and the first MOS N1, wherein a source end of the first MOS is connected to the ground, and a gate end of the same forms a second connection end of the fuse link programming cell, the second connection end being connected to a first word line WLo.

A second effuse cell includes:
a second fuse link (link2), wherein a first end of the second link forms a third connection end of the fuse link programming cell, the third connection end being connected to a second bit line BL2, and a second end of the same is connected to a drain end of a second MOS N2; and the second MOS N2, wherein a source end of the second MOS is connected to the ground, and a gate end of the same forms a fourth connection end of the fuse link programming cell, the fourth connection end being connected to a second word line WLe.

A source end of the mode control transistor Nsw is connected to the bit line BL2 of the second effuse cell, a drain end of the same is connected to the source end of the first MOS N1, and a gate end of the same forms a fifth connection end of the fuse link programming cell, the fifth connection end being connected to a correction signal REWL.

Optionally, in the fuse link programming cell, the first MOS N1, the second MOS N2, and the mode control transistor Nsw are NMOSs.

The fuse link programming cell according to the present disclosure comprises of two efuse cells and one NMOS transistor, forming a 5-port device (BL1, BL2, REWL, WLo, and WLe), as shown in FIG. 3. The first efuse cell comprises the fuse link link1 and the control transistor N1, and the second efuse cell comprises the fuse link link2 and the control transistor N2. One end of the fuse link link1 forms the BL1 port of the cell, and the other end of the fuse link link1 is connected to the drain end of the control transistor N1, and connected to the drain end of the NMOS transistor Nsw (for mode control). One end of the fuse link link 2 forms the BL2 port of the cell, the other end of the fuse link link 2 is connected to the drain end of the control transistor N2, and the source end of N2 is grounded. The source end of the mode control transistor Nsw is connected to the BL2 port of the cell, and the gate end of the same forms the REWL port of the cell. The gate end of the control transistor N1 forms the WLo port of the cell, and the gate end of the control transistor N2 forms the WLe port of the cell.

The present application provides a fuse link programming circuit of the above-mentioned fuse link programming cell, further including:
- a first power supply control transistor Mp1, wherein a drain end of the first power supply control transistor is connected to a first bit line BL1, a gate end of the same is connected to a first programming control signal BLC1, and a source end of the same is connected to a programming power supply VDDQ;
- a first read control transistor Mn1, wherein a drain end of the first read control transistor is connected to the first bit line BL1, a gate end of the same is connected to a first read control signal RDR, and a source end of the same is connected to a first SA module SA1; and
- a second power supply control transistor Mp2, wherein a drain end of the second power supply control transistor is connected to a second bit line BL2, a gate end of the same is connected to a second programming control signal BLC1, and a source end of the same is connected to the programming power supply VDDQ; and a second read control transistor Mn2, wherein a drain end of the second read control transistor is connected to the second bit line BL2, a gate end of the same is connected to a second read control signal RDR, and a source end of the same is connected to a second SA module SA2.

Optionally, in the fuse link programming circuit, the first power supply control transistor Mp1 and the second power supply control transistor Mp2 are PMOSs, and the first read control transistor Mn1 and the second read control transistor Mn2 are NMOSs.

The fuse link programming circuit of the present disclosure is shown in FIG. 4. The port BL1 of the basic cell shown in FIG. 3 is separately connected to the drain end of the power control transistor Mp1 and the drain end of the read control transistor Mn1. The source end of Mp1 is connected to the programming power supply VDDQ, and the source end of Mn1 is grounded. The gate end of Mp1 is connected to the programming control signal BL1C, and the gate end of Mn1 is connected to the read control signal RDR. The port BL2 of the basic cell is connected to the drain end of the power control transistor Mp2 and the drain end of the read control transistor Mn2. The source end of Mp2 is connected to the programming power supply VDDQ, and the source end of Mn2 is grounded. The gate end of Mp2 is connected to the programming control signal BL2C, and the gate end of Mn2 is connected to the read control signal RD.

The REWL, WLo, and WLe ports of the basic cell are respectively connected to corresponding control signals.

The present disclosure provides a control circuit for the above-mentioned fuse link programming circuit, including:
- two AND gates and one inverter.

A first input end of a first AND gate and a second input end of a second AND gate are connected to function as a first input end of the control circuit which is connected a word control signal WL, a second input end of the same and an input end of the inverter are connected to function as a second input end of the control circuit which is connected a correction control signal RE, and an output end of the same functions as a first output end of the control circuit.

A first input end of the second AND gate is connected to an output end of the inverter, and the output end of the same functions as a second output end of the control circuit.

A third output end of the control circuit is connected to the word control signal WL.

Optionally, in the control circuit for a fuse link programming circuit, when the correction control signal RE is 1, a correction mode is enabled, the first AND gate outputs the word control signal, and an output signal of the second AND gate is 0.

When the correction control signal RE is 0, a normal mode is enabled, an output signal of the first AND gate is 0, and an output signal of the second AND gate is the word control signal WL.

An input signal of a second word line WLe of a fuse link programming cell is always the word control signal WL.

The control circuit for a cell of the present application is shown in FIG. 5, and comprises two AND gates and one inverter. The input signals are WL (word control) and RE (correction control). The signal RE controls a switch between the correction mode and the normal mode. When RE=1, the correction mode is enabled, the REWL output is WL, and the WLo output is 0. When RE=0, the normal mode is enabled, the REWL output is 0, the WLo output is WL, and WLe is always WL.

In order to solve the above technical problem, the present application provides a fuse link programming cell array composed of n rows of fuse link programming circuits of claim 3 and n control circuits of claim 5, each row including at least two of the fuse link programming circuits, and each row including one of the control circuits, and n≥1.

Optionally, in the fuse link programming cell array, in a first read operation working mode (normal working mode): when the n-th programming control signal BLCn is 1, all power supply control transistors MPn between a programming power supply VDDQ and bit lines BL1-BLn are turned off.

The first correction signal to n-th correction signal REWL1-REWLn are 0, each efuse cell on the odd-column bit line is disconnected from an efuse cell on the even-column bit line in the array, and all the efuse cells on odd and even columns are valid.

A first word line WLon signal of the n-th efuse cell is 1, a second word line WLen signal of the n-th efuse cell is 1, a first read control signal RDR is 1, a second read control signal RD is 1, and first SA module to n-th SA module SA1-SAn read information of efuse cells on all columns of said row.

Optionally, in the fuse link programming cell array, in a second read operation working mode (redundancy working mode): when the n-th programming control signal BLCn is 1, all power supply control transistors MPn between a programming power supply VDDQ and bit lines BL1-BLn are turned off.

The n-th correction signal REWLn is 0, and on a row where the n-th correction signal REWLn is located in the array, an efuse cell on the odd-column bit line is in short circuit with an efuse cell on the even-column bit line.

A second read control signal RD is 0, a path from each even-column SA module to the ground is turned off, a second word line WLen signal of the row where the n-th correction signal REWLn is located is 1, a second word line WLen signal is 0, an even-column control transistor on the row where the n-th correction signal REWLn is located is turned on, and the other control transistors are turned off.

A first read control signal RDR is 1, a current of an odd-column SA module flows through a link of the odd-column efuse cell and a mode control transistor Nsw on the row where the n-th correction signal REWLn is located, the even-column efuse cell on the row where the n-th correction signal REWLn is located is grounded, and the SA module converts the sum of link resistances of the two efuse cells into a logic value.

That is, the odd-column efuse cell on each row functions as a storage bit, and the adjacent even-column efuse cell functions as a redundancy of the storage bit.

The fuse link programming cell array according to the present disclosure includes a cell array and a control circuit, as shown in FIG. 6. The cell array comprises an odd/even bit line BLn, an odd/even word line WLon/WLen, a mode control line REWLn, an efuse basic cell, a PMOS power supply control transistor Mpn, and an NMOS read function control transistor Mnn. The control circuit comprises AND gates and an inverter. Input control signals are mode control signal RE and word control signal WLn, and output signals are REWLn, WLen, and WLon. Cell control signals on each row are WLo1-$n$, WLe1-$n$, and REWL1-$n$. Cells on each column are connected to the same bit line BLn−1 and BLn. The bit line is connected to the VDDQ by means of the power supply control transistor Mp controlled by the BLC, and connected to the SAn module by means of the read control transistor Mn controlled by the RDR and RD.

The fuse link programming cell array of the present application includes two read operation working modes: the normal mode and the redundancy mode.

FIG. 8a is a schematic diagram of a read operation in the normal mode. When BLCn=1, all the power supply control transistors between the VDDQ and the bit line BLn are turned off. REWL1-$n$=0, each efuse cell on the odd-column bit line is disconnected from an efuse cell on the even-column bit line in the array, and all the efuse cells on odd and even columns are valid. WLne=1, WLno=1, RDR=1, RD=1, and SA1-$n$ read information of efuse cells on all columns of said row.

FIG. 8b is a schematic diagram of a read operation in the redundancy mode. When BLCn=1, all the power supply control transistors between the VDDQ and BLn are turned off. REWLn=1, and on a row where REWLn is located in the array, an efuse cell on the odd-column bit line is in short circuit with an efuse cell on the even-column bit line. RD=0, a path from each even-column SA module to the ground is turned off. WLen on the row where REWLn is located is 1, WLno on the row where REWLn is located is 0, an even-column control transistor on the row is turned on, and the other control transistors are turned off. RDR=1, the current of the odd-column SA flows through a resistor of the odd-column efuse cell and a gating transistor Nsw on the row where REWLn is located, the even-column efuse cell is grounded, and the SA converts the sum of link resistances of the two efuse cells into a logic value. That is, the odd-column efuse cell on each row functions as a storage bit, and the adjacent even-column efuse cell functions as a redundancy of the storage bit. In this case, the two cells are both 0 before programming, and the sum of the two cells output by SA is also 0; the two cells are both 1 after programming, and the output of SA is 1; and if one of the two cells is valid by being 0, the sum of the two cells output by SA is still 1. Therefore, the present application can realize the function of two cells being redundant with respect to each other.

The fuse link programming cell, programming circuit, control circuit, and array according to the present disclosure improve the use flexibility of the efuse cell array by modifying the circuit and adding mode control on the basis of the conventional array, and realize the redundancy correction function of each storage bit. The circuit and control mode of the efuse cell array are improved, so that read and write operations can be performed on all the storage bits, and half of the capacity of a storage physical region is used for storage while the other half is used for redundancy correction backup.

Taking an efuse cell having an 8192-bit capacity and 32-bit output bit width as an example, in a conventional redundancy correction mode, during correction of one bit, a 16-bit capacity is required to store address and correction value information of said bit. Therefore, for the 8192-bit capacity, in order to realize correction of all the storage bits, the actual effective capacity of the efuse cell is only 482 bits, while the rest of the capacity is used as a redundancy correction storage region, i.e., 482 (actual)+482×16 (redundant)=8194 bits (closest to the total capacity of 8192 bits). However, if an 8K effuse cell of the same capacity in the array solution of the present application is used to achieve the redundancy correction capability of the entire storage capacity, an actual storage space can reach 4096 bits, which is much greater than 482 bits in the conventional redundancy solution design.

BRIEF DESCRIPTION OF THE DRAWINGS

The drawings of the present application are intended to show the general characteristics of the methods, structures and/or materials used in the specific exemplary embodiments of the present application, and to supplement the description. However, the drawings of the present application are not drawn to scale, and therefore may not accurately reflect the exact structure or performance characteristics of any given embodiment. The drawings of the present application should not be interpreted as defining or limiting the range of values or attributes covered by the exemplary embodiments of the present application. The present application is described in detail below with reference to the drawings and specific embodiments.

DETAILED DESCRIPTION OF THE DISCLOSURE

Figure 1:
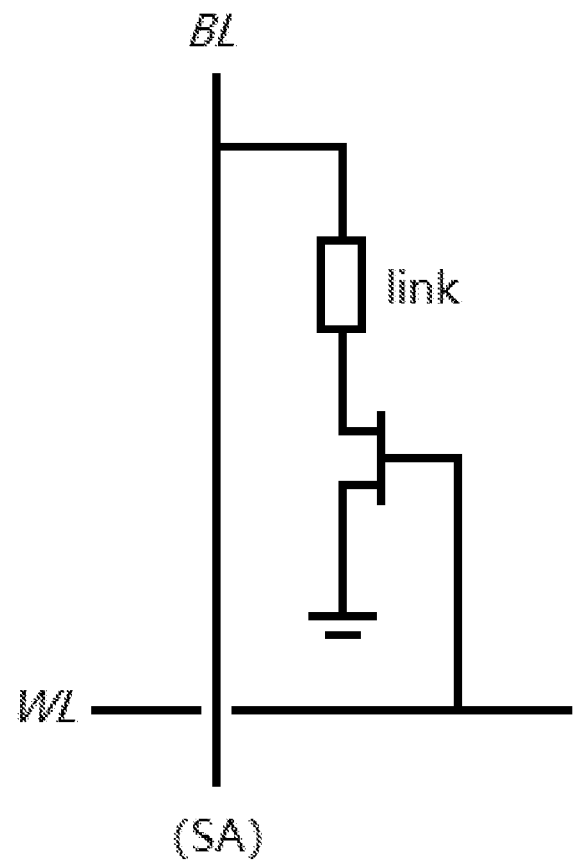
FIG. 1 is a schematic diagram of a conventional efuse cell.
Figure 2:
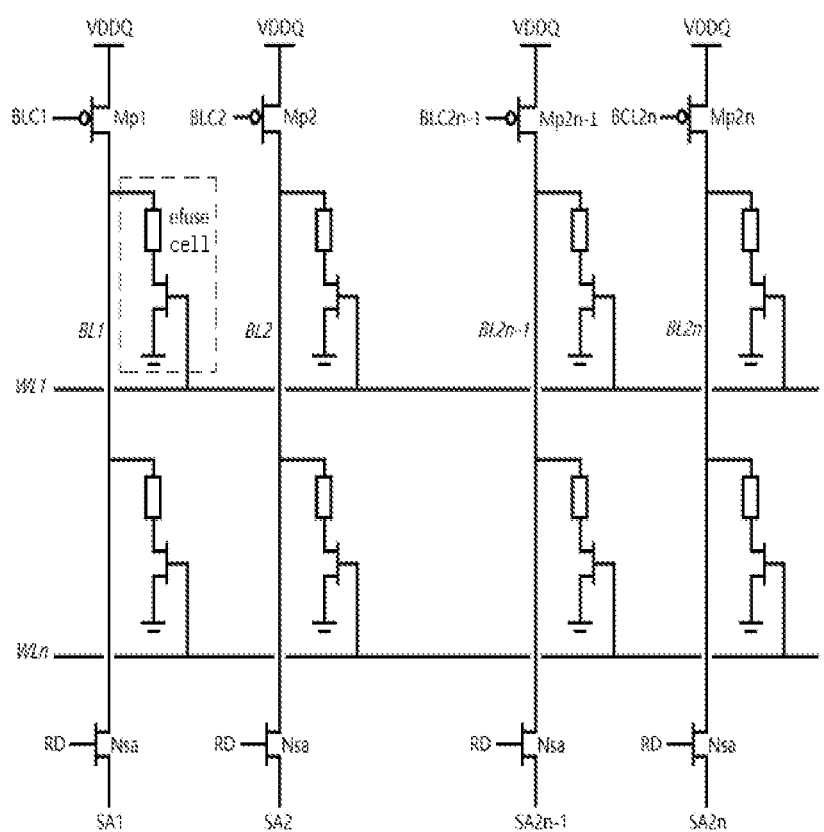
FIG. 2 is a schematic diagram of a conventional efuse cell array.

The implementations of the present application are described below using specific embodiments. Those skilled in the art can fully understand other advantages and technical effects of the present application from the contents disclosed in the description. The present application can also be implemented or applied in different specific implementations. The various details in the description can also be applied based on different views, and various modifications or changes can be made without departing from the general design idea of the present application. It should be noted that the following embodiments and features in the embodiments can be combined with each other without conflict. The following exemplary embodiments of the present application can be implemented in many different forms, and should not be interpreted as being limited to the specific embodiments described herein. It should be understood that these embodiments are provided to make the disclosure of the present application full and complete, and to fully convey the technical solutions of these exemplary specific embodiments to those skilled in the art. It should be understood that when an element is claimed to be "connected" or "combined" with another element, this element can be directly connected or combined with another element, or there may be an intermediate element. However, when an element is claimed to be "directly connected" or "directly combined" with another element, there is no intermediate element. In all of the drawings, the same reference numeral always represents the same element.

Embodiment 1

Figure 3:
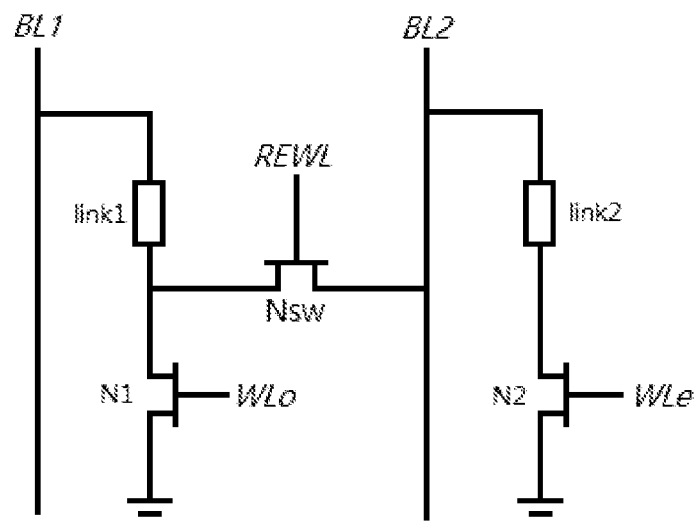
FIG. 3 is a schematic diagram of a fuse link programming cell according to the present disclosure.

Referring to FIG. 3, the present application provides a fuse link programming cell including two effuse cells and one mode control transistor Nsw.

A first effuse cell includes:

a first fuse link link1, wherein one end of the first link forms a first connection end of the fuse link programming cell, the first connection end being connected to a first bit line BL1, and a second connection end of the fuse link programming cell is connected to a drain end of a first MOS N1; and the first MOS N1, wherein a source end of the first MOS is connected to the ground, and a gate end of the same forms a second connection end of the fuse link programming cell, the second connection end being connected to a first word line WLo.

A second effuse cell includes:

a second fuse link link2, wherein a first end of the second link forms a third connection end of the fuse link programming cell, the third connection end being connected to a second bit line BL2, and a second end of the same is connected to a drain end of a second MOS N2; and a second MOS N2, wherein a source end of the second MOS is connected to the ground, and a gate end of the same forms a fourth connection end of the fuse link programming cell, the fourth connection end being connected to a second word line WLe.

A source end of the mode control transistor Nsw is connected to the line end BL2 of the second effuse cell, a drain end of the same is connected to the source end of the first MOS N1, and a gate end of the same forms a fifth connection end of the fuse link programming cell, the fifth connection end being connected to a correction signal REWL.

The first MOS N1, the second MOS N2, and the mode control transistor Nsw are NMOSs.

In addition, it should also be understood that although the terms "first", "second" etc. can be used herein to describe different elements, parameters, components, regions, layers, and/or parts, these elements, parameters, components, regions, layers, and/or parts should not be restricted by these terms. These terms are only used to distinguish one element, parameter, component, region layer, or part from another element, parameter, component, region, layer, or part. Therefore, without departing from the teaching of the exemplary embodiments of the present application, the first element, parameter, component, region, layer, or part described below can also be referred to as the second element, parameter, component, region, layer, or part.

Embodiment 2

Figure 4:
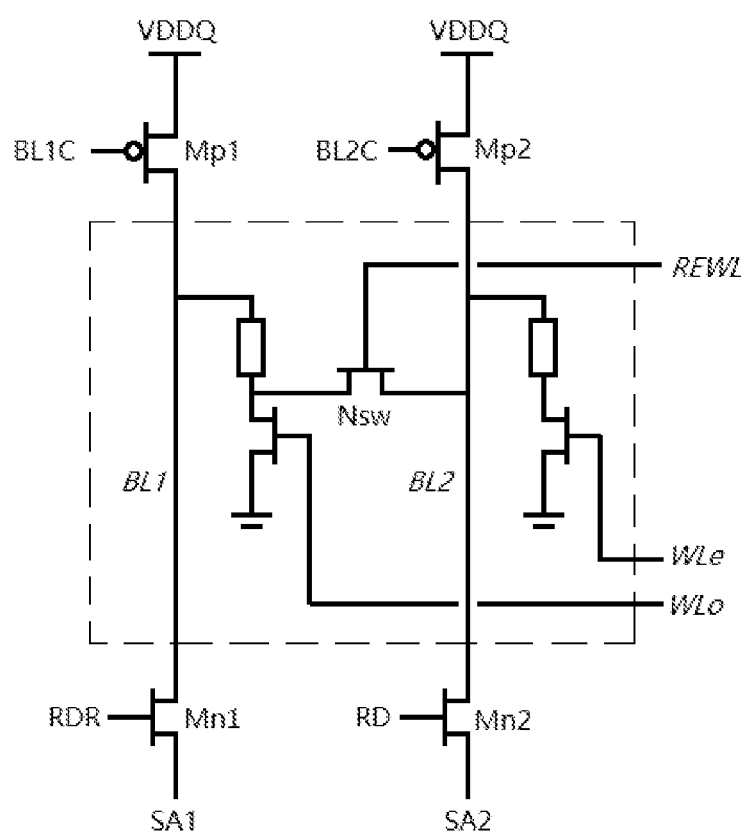
FIG. 4 is a schematic diagram of a fuse link programming circuit according to the present disclosure.

Referring to FIG. 4 the present application provides a fuse link programming circuit which has the fuse link programming cell of embodiment 1, further including:

a first power supply control transistor Mp1, wherein a drain end of the first power supply control transistor is connected to a first bit line BL1, a gate end of the same is connected to a first programming control signal BLC1, and a source end of the same is connected to a programming power supply VDDQ;

a first read control transistor Mn1, wherein a drain end of the first read control transistor is connected to the first bit line BL1, a gate end of the same is connected to a first read control signal RDR, and a source end of the same is connected to a first SA module SA1;

a second power supply control transistor Mp2, wherein a drain end of the second power supply control transistor is connected to a second bit line BL2, a gate end of the same is connected to a second programming control signal BLC1, and a source end of the same is connected to the programming power supply VDDQ; and a second read control transistor Mn2, wherein a drain end of the second read control transistor is connected to the second bit line BL2, a gate end of the same is connected to a second read control signal RDR, and a source end of the same is connected to a second SA module SA2.

The first power supply control transistor Mp1 and the second power supply control transistor Mp2 are PMOSs, and the first read control transistor Mn1 and the second read control transistor Mn2 are NMOSs.

Embodiment 3

Figure 5:
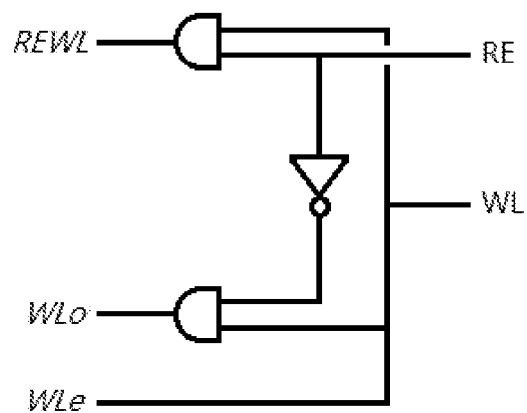
FIG. 5 is a schematic diagram of a control circuit according to the present disclosure.

Referring to FIG. 5, the present application provides a control circuit for the above-mentioned fuse link programming circuit, including:

two AND gates and one inverter.

A first input end of a first AND gate and a second input end of a second AND gate are connected to function as a first input end of the control circuit which is connected a word control signal WL, a second input end of the same and an input end of the inverter are connected to function as a second input end of the control circuit which is connected a correction control signal RE, and an output end of the same functions as a first output end of the control circuit.

A first input end of the second ND gate is connected to an output end of the inverter, and the output end of the same functions as a second output end of the control circuit.

A third output end of the control circuit is connected to the word control signal WL.

When the correction control signal RE is 1, a correction mode is enabled, the first AND gate outputs the word control signal, and an output signal of the second AND gate is 0.

When the correction control signal RE is 0, a normal mode is enabled, an output signal of the first AND gate is 0, and an output signal of the second AND gate is the word control signal WL.

An input signal of a second word line WLe of a fuse link programming cell is always the word control signal WL.

Embodiment 4

Figure 6:
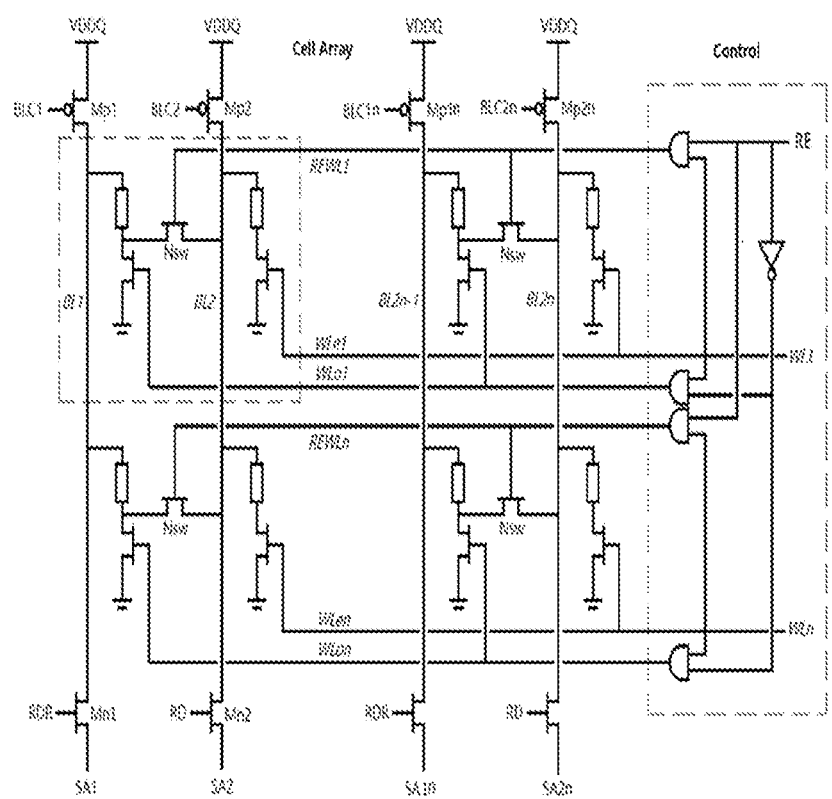
FIG. 6 is a schematic diagram of a fuse link programming cell array according to the present disclosure.
Figure 7A:
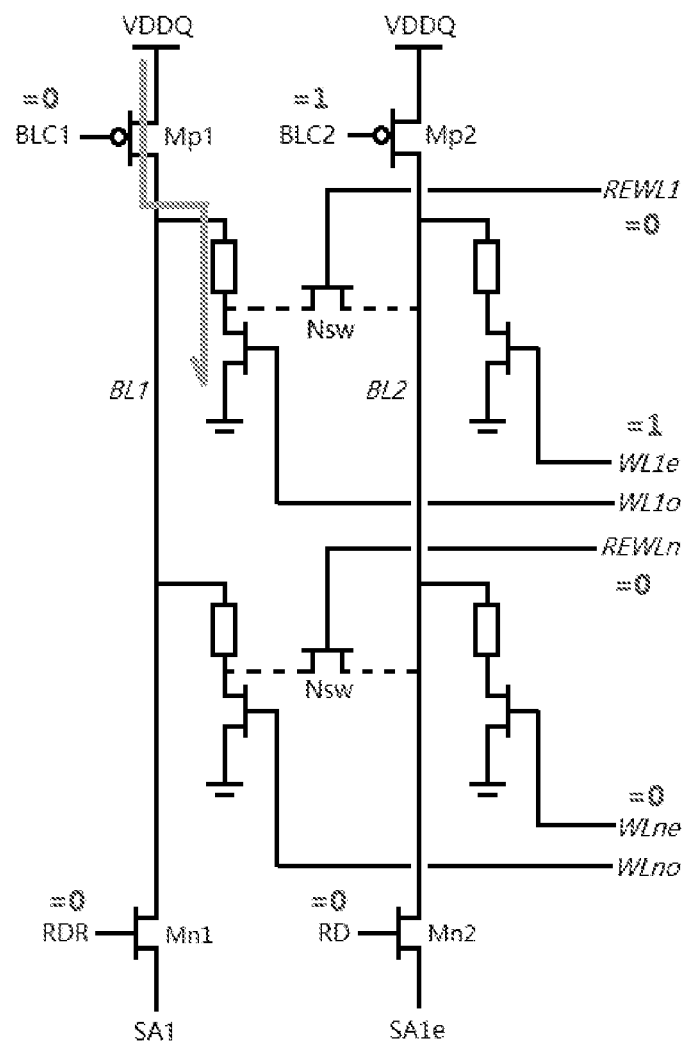
FIG. 7a is a schematic diagram of a programming state of an odd-column effuse cell in a programming operation on the fuse link programming cell array according to the present disclosure.
Figure 7B:
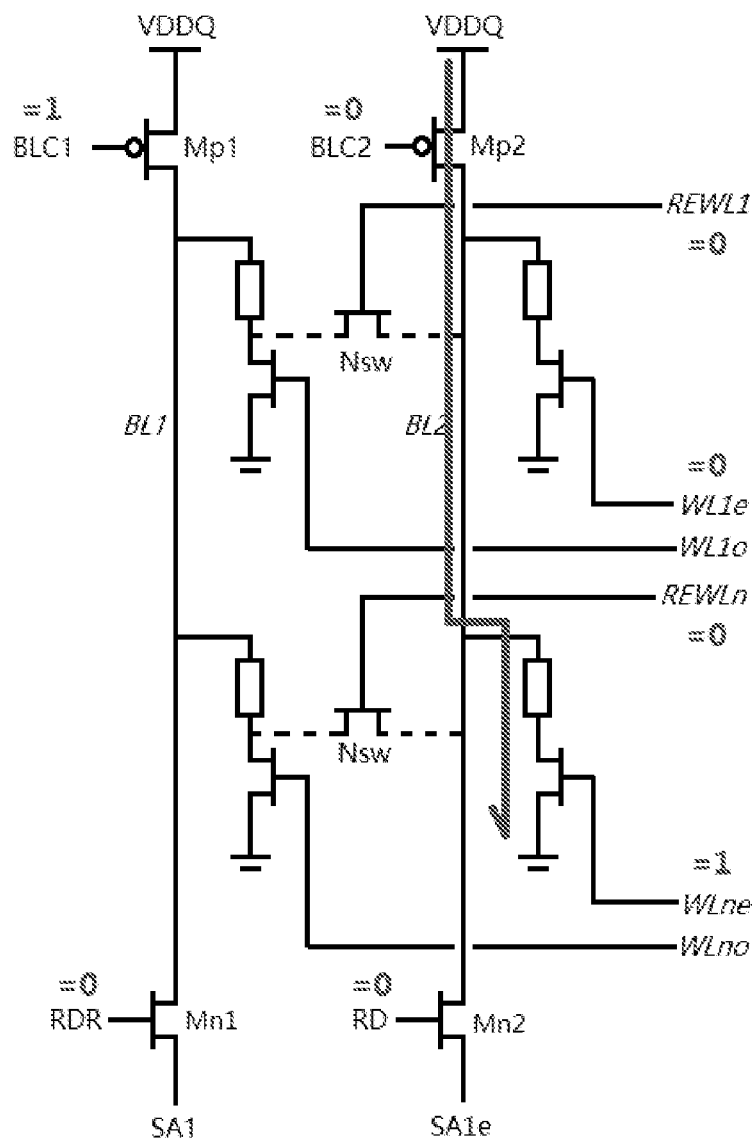
FIG. 7b is a schematic diagram of a programming state of an even-column effuse cell in a programming operation on the fuse link programming cell array according to the present disclosure.

Referring to FIG. 6, the present application provides a fuse link programming cell array composed of n rows of fuse link programming circuits of embodiment 2 and n control circuits of embodiment 3, each row including at least two of the fuse link programming circuits, and each row including one of the control circuits, n≥1.

The case of n rows of fuse link programming circuits, each row including n fuse link programming cells, is taken as an example for description only, but should not be interpreted herein as defining the number of fuse link programming cells in each row.

The first end of the n-th fuse link programming cell in the n-th row is connected to the n-th first bit line BL1$n$, the second connection end is connected to the n-th first bit line WLo$n$, the third connection end is connected to the n-th second bit line BL2$n$, the fourth connection end is connected to the n-th second bit line WLe$n$, and the fifth connection end is connected to the n-th correction signal REWL$n$.

The drain end of the n-th first power supply control transistor Mp1$n$ is connected to the n-th first bit line BL1$n$, the gate end of the same is connected to the n-th programming control signal BLC1$n$, and the source end of the same is connected to the programming power supply VDDQ.

The drain end of the n-th second power supply control transistor Mp2$n$ is connected to the n-th second bit line BL2$n$, the gate end of the same is connected to the n-th programming control signal BLC2$n$, and the source end of the same is connected to the programming power supply VDDQ.

The drain end of the n-th first read control transistor Mn1$n$ is connected to the n-th first bit line BL1$n$, the gate end of the same is connected to the first read control signal RDR, and the source end of the same is connected to the n-th first SA module SA1$n$.

The drain end of the n-th second read control transistor Mn2$n$ is connected to the n-th second bit line BL2$n$, the gate end of the same is connected to the second read control signal RD, and the source end of the same is connected to the n-th second SA module SA2$n$.

The source end of the n-th mode control transistor Nsw$n$ is connected with the n-th second bit line BL2$n$, and the gate end of the same is connected to the n-th correction signal REWL$n$.

The first input end of the n-th first AND gate and the second input end of the n-th second AND gate are connected to function as the first input end of the control circuit which is connected the n-th word control signal WL$n$, the second input end of the same and the input end of the n-th inverter are connected to function as the second input end of the control circuit which is connected to the n-th correction control signal RE$n$, and the output end of the same functions as the first output end of the control circuit which outputs the n-th correction signal REWL$n$.

The first input end of the n-th second ND gate is connected to the output end of the n-th inverter, and the output end of the same functions as the second output end of the control circuit which outputs the n-th first word line signal WLo$n$.

The third output end of the control circuit is connected to the n-th word control signal WL$n$, i.e., receiving the n-th second word line signal WLe$n$.

Figure 8A:
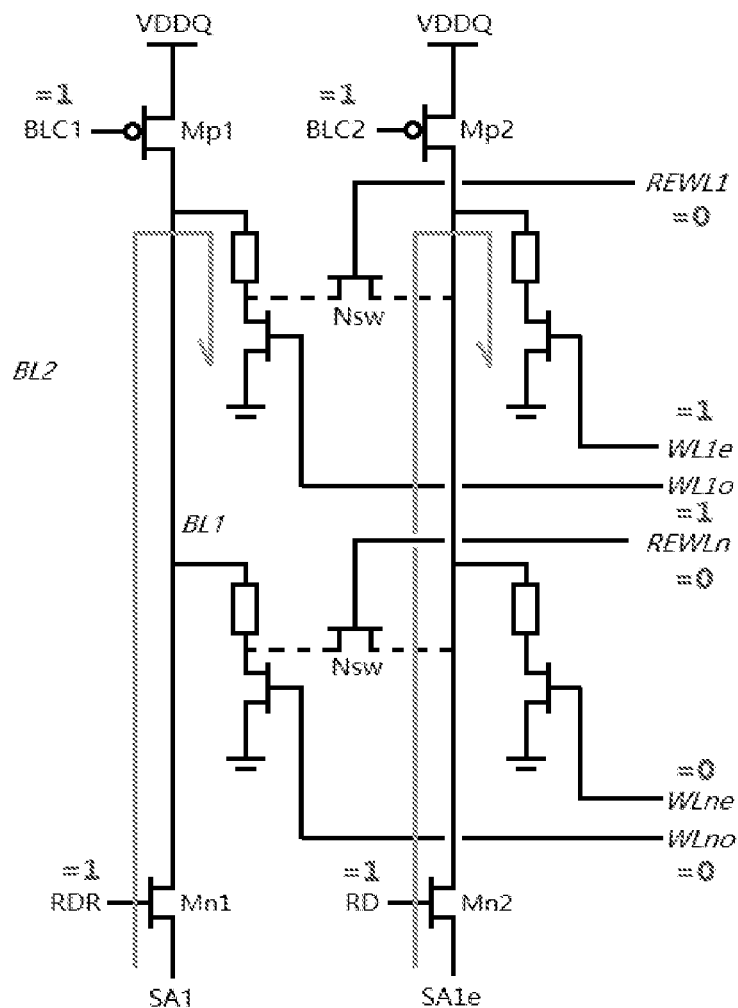
FIG. 8a is a schematic diagram of a read operation in a normal mode of the fuse link programming cell array according to the present disclosure.
Figure 8B:
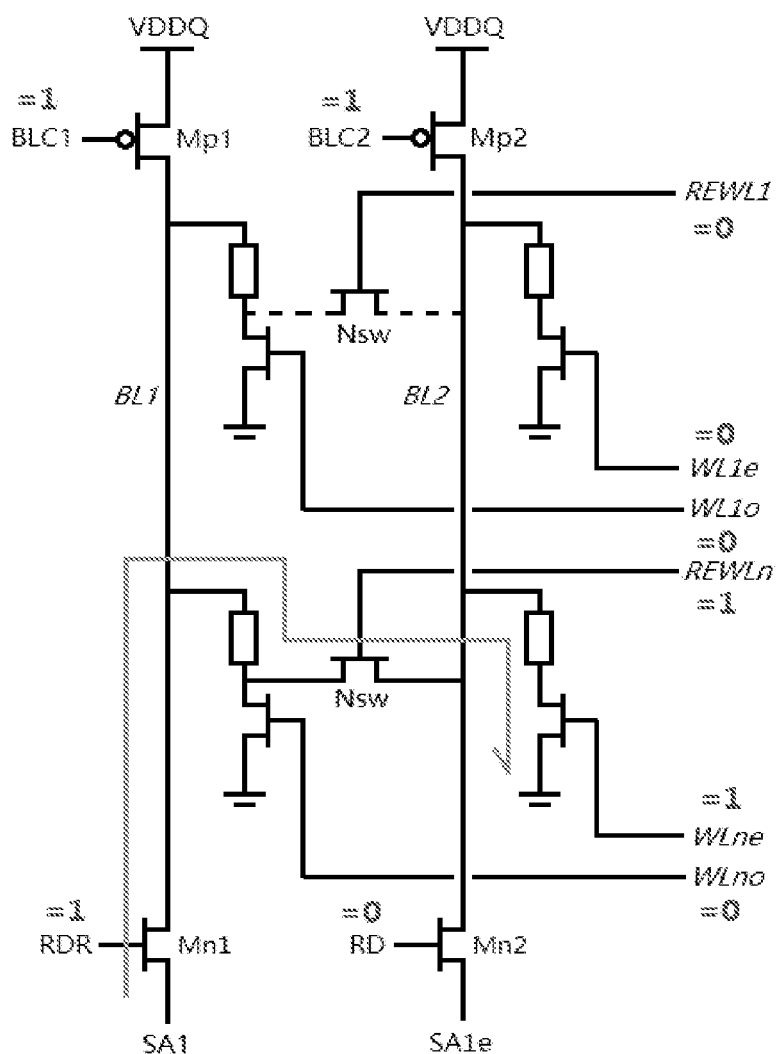
FIG. 8b is a schematic diagram of a read operation in a redundancy mode of the fuse link programming cell array according to the present disclosure.

Referring to FIG. 8$a$, in the first read operation working mode: when BLC$n$=1, all the power supply control transistors between the VDDQ and the bit line BL$n$ are turned off. REWL1-$n$=0, each efuse cell on the odd-column bit line is disconnected from an efuse cell on the even-column bit line in the array, and all the efuse cells on odd/even columns are valid. WLne=1, WLno=1, RDR=1, RD=1, and SA1-$n$ read information of efuse cells on all columns of said row.

Referring to FIG. 8$b$, in the second read operation working mode: when BLC$n$=1, all the power supply control transistors between the VDDQ and BL$n$ are turned off. REWL$n$=1, and on a row where REWL$n$ is located in the array, an efuse cell on the odd-column bit line is in short circuit with an efuse cell on the even-column bit line. RD=0, a path from each even-column SA module to the ground is turned off. WLe$n$ on the row where REWL$n$ is located is 1, WLo$n$ on the row where REWL$n$ is located is 0, an even-column control transistor on the row is turned on, and the other control transistors are turned off. RDR=1, the current of the odd-column SA flows through a resistor of the odd-column efuse cell and a gating transistor Nsw on the row where REWL$n$ is located, the even-column efuse cell is grounded, and the SA converts the sum of link resistances of the two efuse cells into a logic value. That is, the odd-column efuse cell on each row functions as a storage bit, and the adjacent even-column efuse cell functions as a redundancy of the storage bit. In this case, the two cells are both 0 before programming, and the sum of the two cells output by SA is also 0; the two cells are both 1 after programming, and the output of SA is 1; and if one of the two cells is valid by being 0, the sum of the two cells output by SA is still 1. Therefore, the present application can realize the function of two cells being redundant with respect to each other.

Unless otherwise defined, all terms used herein (including technical terms and scientific terms) have the same meaning as those commonly understood by those of ordinary skill in the art. It should also be understood that, unless explicitly defined herein, such terms as those defined in the general dictionary should be interpreted as having the meaning consistent with their meaning in the context of the relevant field, rather than being interpreted in an ideal or overly formal sense.

The present application is described in detail above using specific implementations and embodiments, which, however, are not intended to limit the present application.

Without departing from the principle of the present application, those skilled in the art can also make many changes and improvements, which should also be construed as the protection scope of the present application.

What is claimed is:

1. A fuse link programming cell, comprising:
   two effuse cells and one mode control transistor (Nsw);
      wherein a first effuse cell of the two effuse cells comprises:
      a first link (link1), wherein one end of the first link forms a first connection end of a fuse link programming cell, wherein the first connection end connects to a first bit line (BL1), and a second connection end of the fuse link programming cell is connected to a drain end of a first MOS (N1);
   wherein a source end of the first MOS is connected to a ground, a gate end of the first MOS forms a second connection end of the fuse link programming cell, wherein the second connection end of the fuse link programming cell is connected to a first word line (WLo);
      wherein a second effuse cell of the two effuse cells comprises:
      a second link (link2), wherein a first end of the second link forms a third connection end of the fuse link programming cell, wherein the third connection end of the fuse link programming cell is connected to a second bit line (BL2), and wherein a second connection end of the fuse link programming cell is connected to a drain end of a second MOS (N2);
   wherein a source end of the second MOS is connected to the ground, a gate end of the second MOS forms a fourth connection end of the fuse link programming cell, wherein the fourth connection end is connected to a second word line (WLe);
      wherein a source end of the mode control transistor is connected to the second bit line (BL2), a drain end of the mode control transistor is connected to the source end of the first MOS (N1), and a gate end of the mode control transistor forms a fifth connection end of the fuse link programming cell, and wherein the fifth connection end of the fuse link programming cell is connected to a correction signal (REWL).

2. The fuse link programming cell according to claim 1, wherein the first MOS (N1), the second MOS (N2), and the mode control transistor (Nsw) are NMOSs.

3. A fuse link programming circuit having the fuse link programming cell of claim 1, further comprising:
   a first power supply control transistor (Mp1), wherein a drain end of the first power supply control transistor is connected to a first bit line (BL1), a gate end of the first power supply control transistor of the same is connected to a first programming control signal (BLC1), and a source end of the first power supply control transistor is connected to a programming power supply (VDDQ);
   a first read control transistor (Mn1), wherein a drain end of the first read control transistor is connected to the first bit line (BL1), a gate end of the first read control transistor is connected to a first read control signal (RDR), and a source end of the first read control transistor is connected to a first SA module (SA1);
   a second power supply control transistor (Mp2), wherein a drain end of the second power supply control transistor is connected to a second bit line (BL2), a gate end of the second power supply control transistor is connected to a second programming control signal (BLC1), and a source end of the second power supply control transistor is connected to the programming power supply (VDDQ); and
   a second read control transistor (Mn2), wherein a drain end of the second read control transistor is connected to the second bit line (BL2), a gate end of the second read control transistor is connected to a second read control signal (RDR), and a source end of the second read control transistor is connected to a second SA module (SA2).

4. The fuse link programming circuit according to claim 3, wherein the first power supply control transistor (Mp1) and the second power supply control transistor (Mp2) are PMOSs, and the first read control transistor (Mn1) and the second read control transistor (Mn2) are NMOSs.

5. A control circuit for the fuse link programming circuit of claim 3, comprising:
   two AND gates and one inverter;
      wherein the two AND gates comprise a first AND gate and a second AND gate, wherein a first input end of the first AND gate and a second input end of the second AND gate are connected to function as a first input end of the control circuit, wherein the control circuit is connected a word control signal (WL), wherein a second input end of the control circuit and an input end of the inverter are connected to function as the second input end of the control circuit, wherein the control circuit is connected a correction control signal (RE), and wherein an output end of the control circuit functions as a first output end of the control circuit;
   a second ND gate, wherein a first input end of the second ND gate is connected to an output end of the inverter, and wherein the output end of the second ND gate functions as a second output end of the control circuit; and
   wherein a third output end of the control circuit is connected to the word control signal (WL).

6. The control circuit for the fuse link programming circuit according to claim 5,
   wherein:
      when the correction control signal (RE) is 1, a correction mode is enabled, the first AND gate outputs the word control signal, and an output signal of the second AND gate is 0;
      when the correction control signal (RE) is 0, a normal mode is enabled, an output signal of the first AND gate is 0, and the second AND gate outputs the word control signal); and
      an input signal of the second word line (WLe) of the fuse link programming cell is always the word control signal (WL).

7. A fuse link programming cell array comprising n rows of the fuse link programming circuit and n control circuits according to claim 5,
   wherein each row of fuse link programming circuits comprises at least two of the fuse link programming circuits, and
   wherein each row comprises one of the n control circuits, and wherein n≥1.

8. The fuse link programming cell array according to claim 7,
   wherein in a first read operation working mode: when the n-th programming control signal (BLCn) is 1, all power supply control transistors (MPn) between the programming power supply (VDDQ) and bit lines (BL1-BLn) are turned off;

wherein when a first correction signal to n-th correction signal (REWL1-REWLn) are 0, each of efuse cells on an odd-column bit line is disconnected from each of efuse cells on an even-column bit line in the fuse link programming cell array, and wherein all the efuse cells on the odd and the even columns are valid; and wherein when a first word line (WLon) signal of the n-th efuse cell is 1, a second word line (WLen) signal of the n-th efuse cell is 1, [A&B1] the first read control signal (RDR) is 1, the second read control signal (RD) is 1, and the first SA module to n-th SA module (SA1-SAn) read information from the efuse cells on all columns of said row.

9. The fuse link programming cell array according to claim 7, wherein in a second read operation working mode: when the n-th programming control signal (BLCn) is 1, all power supply control transistors (MPn) between the programming power supply (VDDQ) and bit lines (BL1-BLn) are turned off;

wherein when the n-th correction signal (REWLn) is 1, and on a row where the n-th correction signal (REWLn) is located in the array, an efuse cell on the odd-column bit line is in short circuit with an efuse cell on the even-column bit line;

wherein when a second read control signal (RD) is 0, a path from each even-column SA module to the ground is turned off, a second word line (WLen) signal of the row where the n-th correction signal (REWLn) is located is 1, the second word line (WLen) signal is 0, an even-column control transistor on the row where the n-th correction signal (REWLn) is located is turned on, and other power supply control transistors are turned off; and wherein when the first read control signal (RDR) is 1, a current of an odd-column SA module flows through a link of the odd-column efuse cell and the mode control transistor (Nsw) on the row where the n-th correction signal (REWLn) is located, the even-column efuse cell on the row where the n-th correction signal (REWLn) is located is grounded, and the SA module converts a sum of link resistances of the two efuse cells into a logic value; and wherein odd-column efuse cells on each row function as storage bits, and adjacent even-column efuse cells function as redundancy of the storage bits.

* * * * *